United States Patent [19]

Maurelli et al.

[11] Patent Number: 5,307,312
[45] Date of Patent: Apr. 26, 1994

[54] PROCESS FOR OBTAINING AN N-CHANNEL SINGLE POLYSILICON LEVEL EPROM CELL AND CELL OBTAINED WITH SAID PROCESS

[75] Inventors: Alfonso Maurelli, Sulbiate; Carlo Riva, Monza, both of Italy

[73] Assignee: SGS-Thomson Microelectronics s.r.l., Milan, Italy

[21] Appl. No.: 734,907

[22] Filed: Jul. 24, 1991

[30] Foreign Application Priority Data

Jul. 24, 1990 [EP] European Pat. Off. ........ 90830343.1

[51] Int. Cl.⁵ ...................... H01L 25/04; H01L 27/10
[52] U.S. Cl. .................................... 365/182; 365/185; 257/314; 257/412; 257/315
[58] Field of Search ............... 365/182, 185; 357/23.5, 357/23.6; 257/312, 314, 412

[56] References Cited

U.S. PATENT DOCUMENTS 4,649,520 3/1987 Boaz .
4,970,565 11/1990 Wu et al. .............................. 357/65

OTHER PUBLICATIONS

Julian J. Sanchez et al., "Drain-Engineered Hot-Electron-Resistant Device Structures: A Review" *IEEE Transactions on Electron Devices* vol. 36, No. 6, 1125–1132, Jun. 1989.
Patent Abstracts of Japan vol. 10, No. 129, (E-403) (2186) May 14, 1986.
Kuniyoshi Yoshikawa et al., "An EPROM Cell Structure for EPLDs Compatible with Single Poly Gate Process" *Japanese Journal of Applied Physics; Supplements* 18th Int. Conf. on Solid State Devices (1986) Aug. 20–22, Tokyo, Japan.
P. J. Cacharelis et al., "A Modular 1 micron CMOS Single Polysilicon EPROM PLD Technology" *Technical Digest of the IEDM*, pp. 60–63 San Francisco, California; Dec. 11–14, 1988.
David H. K. Hoe et al., "Cell and Circuit Design for Single-Poly EPROM" *IEEE Journal of Solid-State Circuits*, vol. 24, No. 4, pp. 1153–1157 Aug. 1989.

Primary Examiner—Eugene R. LaRoche
Assistant Examiner—Viet Q. Nguyen
Attorney, Agent, or Firm—Seed and Berry

[57] ABSTRACT

The process provides for the simultaneous N+ type implantation of areas of a semiconductor substrate of type P for the formation of a control gate and of highly doped regions of source and drain, defining a channel region. After oxide growth there is executed the deposition and the definition of a polysilicon layer, one region of which constitutes a floating gate above the control gate and the channel region and partially superimposed over the regions of source and drain.

17 Claims, 2 Drawing Sheets

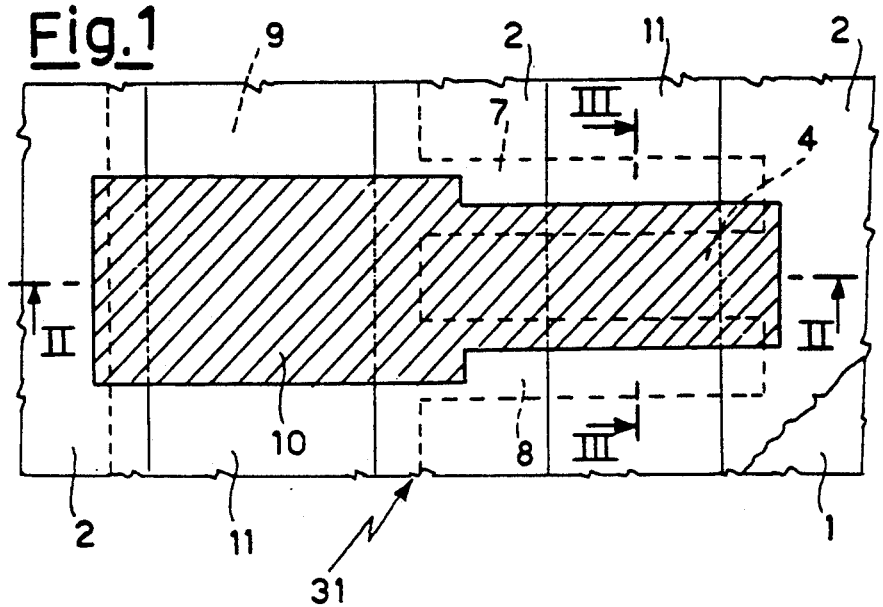
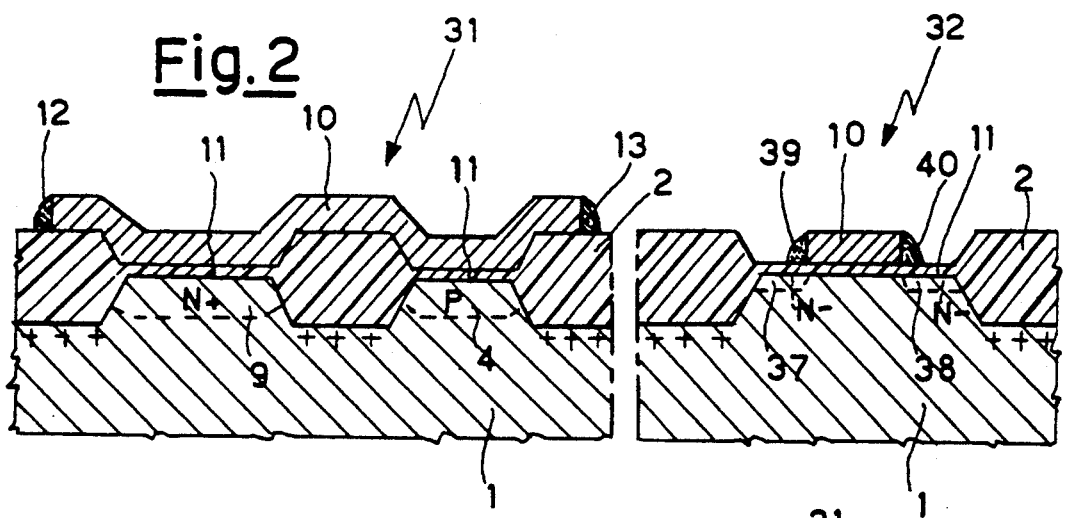
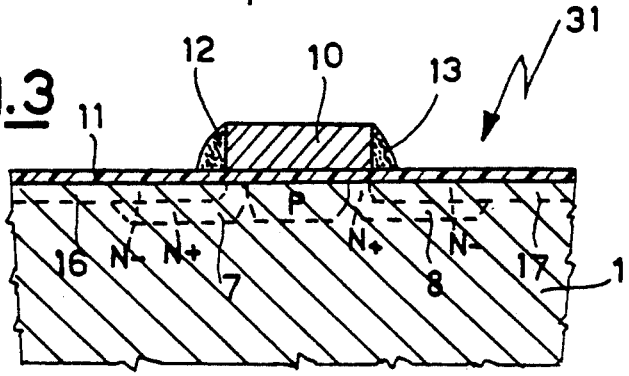

PROCESS FOR OBTAINING AN N-CHANNEL SINGLE POLYSILICON LEVEL EPROM CELL AND CELL OBTAINED WITH SAID PROCESS

FIELD OF THE INVENTION

The present invention relates to a process for obtaining an N-channel single polysilicon level PROM cell and a cell obtained with said process.

BACKGROUND OF THE INVENTION

It is known that for some applications it is preferable to use single polysilicon level EPROM cells (that is, with the floating gate coupled capacitatively to doped source and drain regions of a semiconductor substrate and to a control gate also constituted by a doped region of the same substrate) rather than the more traditional twin polysilicon level EPROM cells.

The custom is also known of accomplishing simultaneously with the cells of an EPROM memory matrix the transistors of an external circuit.

When very small transistors are needed, these can be accomplished with either the LDD (light doped drain) or the DDD (double doped drain) technology, that is, with the formation, on both sides of the floating gate, of oxide spacers superimposed over lightly doped substrate regions adjacent to highly doped source and drain regions.

In this way it is possible to reduce the problems of aging of traditional transistors, while still maintaining the electrical continuity necessary for the transistor's correct operation.

This technology is not applicable to EPROM cells, because the presence of such lightly doped regions would make the writing process extremely slow.

For a normally-fast writing process it is indeed necessary for the EPROM cells to have their floating gate partially superimposed over highly doped source and drain regions.

In order to accomplish a matrix of traditional single polysilicon level EPROM cells simultaneously with LDD- or DDD-type external circuit transistors it is, on the other hand, necessary to use an additional mask with a consequent increase in time and costs.

SUMMARY OF THE INVENTION

The object of the present invention is to accomplish a process for obtaining a single polysilicon level EPROM cell with the floating gate partially superimposed over double doped source and drain regions which, within the scope of a process for obtaining LDD- or DDD-type transistors, does not require the use of an additional mask.

According to the invention such object is attained by means of a process for obtaining an N-channel single polysilicon level EPROM cell, characterized in that it comprises the simultaneous N+ type implantation of semiconductor substrate areas of type P for the formation of a control gate and of highly doped regions of source and drain, defining a channel region, the growth of oxide on said highly doped areas, the deposition and definition of a polysilicon layer one region of which constitutes a floating gate above the control gate and the channel region with partial superimposition of the regions of source and drain, the N-type implantation of portions of said regions of source and drain located at the sides of said floating gate and the formation of oxide spacers partially superimposed over said portions of regions of source and drain at the sides of said floating gate.

In this way it is possible to obtain in an integrated form and without an additional mask an N-channel single polysilicon level EPROM cell with its floating gate partially superimposed over highly doped source and drain regions, and thus capable of guaranteeing a very good performance in terms of writing speed and current absorption, simultaneously with LDD- or DDD-type external circuit transistors, that is, with lightly doped regions under oxide spacers located at the sides of the floating gate.

This is obtained because the high dope implantation utilized for the control gate is also used for the source and drain regions and thus it simultaneously defines the cell channel.

The features of the present invention shall be made more evident by an embodiment illustrated as a non-limiting example in the enclosed drawings.

BRIEF DESCRIPTION OF THE DRAWINGS

FIG. 1 illustrates a single polysilicon level EPROM cell obtained with the process according to the invention;

FIG. 2 is a cross-sectional view taken along the line II—II of FIG. 1, completed with a similar cross-sectional view of an external circuit transistor;

FIG. 3 is a cross-sectional view taken along the Line III—III of FIG. 1;

DETAILED DESCRIPTION OF THE PREFERRED EMBODIMENTS

Figure 4:
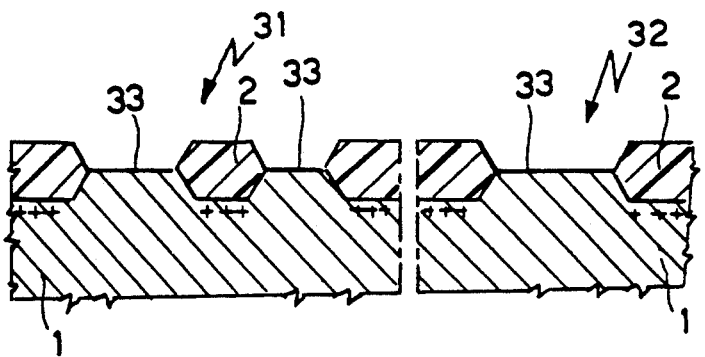
FIGS. 4 to 7 show steps of a process for accomplishing a single polysilicon level EPROM cell and an external circuit transistor, seen in a cross-sectional view similar to that of FIG. 2.

With reference to the above figures, where there is indicated with 31 an area of an N-channel single polysilicon level EPROM cell and with 32 an area of an external circuit transistor, the process according to the present invention provides for both areas the preliminary formation, illustrated in FIG. 4, of areas of field oxide 2 on a semiconductor substrate 1 of type P, for example of boron, with the simultaneous definition of active areas 33.

Figure 5:
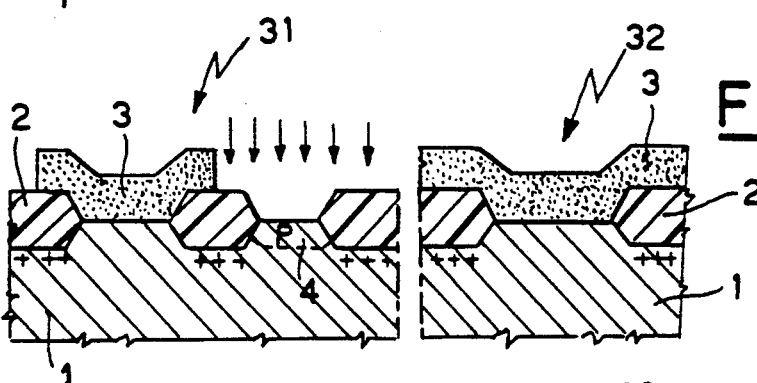

As illustrated in FIG. 5, after the application of a resist mask 3 there is executed an implantation of type P in a channel region 4 of cell 31 with the purpose of raising the threshold voltage of the cell itself.

Figure 6:
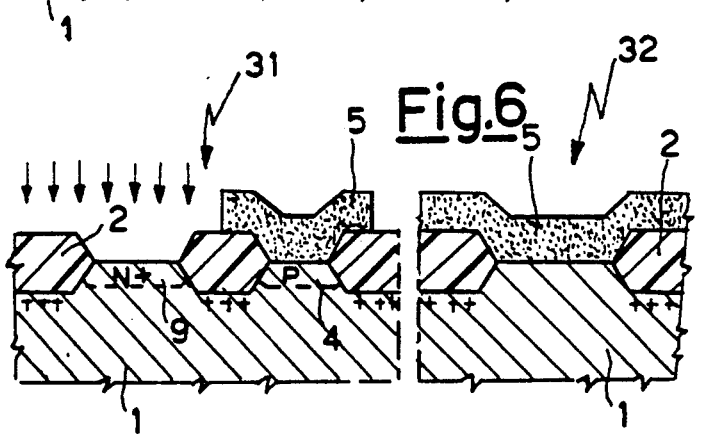
Figure 8:
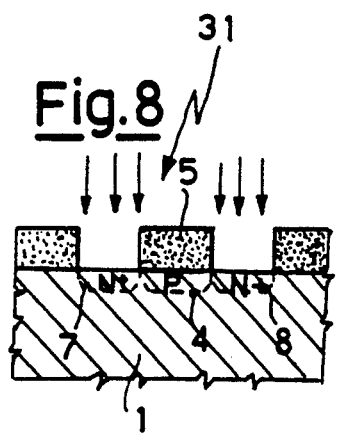
FIGS. 8 and 9 show steps of a process similar to those of FIGS. 6 and 7, seen in a cross-sectional view similar to that of FIG. 3.

With reference to FIGS. 6 and 8, the mask 3 is subsequently replaced by another resist mask 5 and there is executed in the area of cell 31 an implantation of type N+, for example of arsenic with an implant dose of from 1E14 to 1E15 atoms/cm$^2$, for the creation of a control gate 9 and of highly doped regions of source 7 and drain 8, defining the channel region 4.

Figure 7:
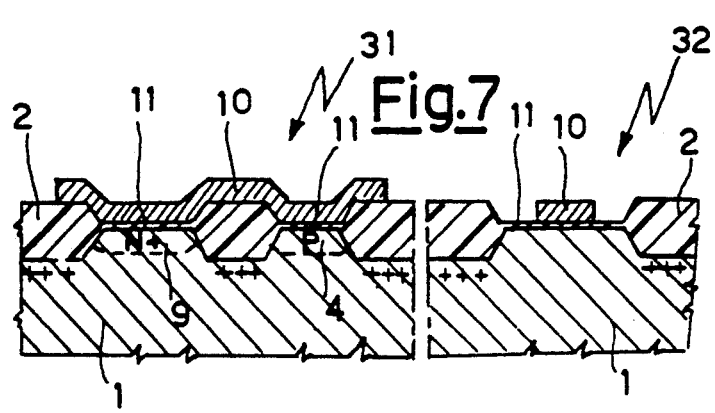
Figure 9:
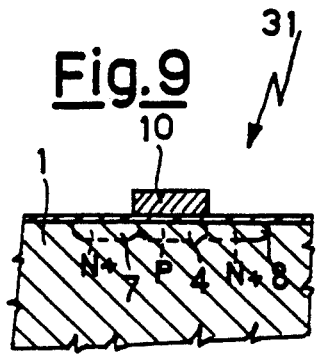

With reference to FIGS. 7 and 9, once the mask 5 is removed there is executed in both areas 31 and 32 a growth of gate oxide 11 which in the area above the control gate 9 has a greater thickness than in the area above channel region 4 of cell 31 and the corresponding region of "transistor 32", given the greater concentration of dope in the first area with respect to the others and given that, as is known, the thicknesses of the oxide also depend on the concentration of dope in the regions below.

There follows the deposition of a layer of polysilicon (or polysilicide) 10, a region of which, after suitable definition, constitutes the floating gate of cell 31, above the control gate 9 and the channel region 4 with partial superimposition of the regions of source 7 and drain 8, while a region forms the gate of transistor 32.

Lastly, as shown in FIGS. 2 and 3, there is provided an implantation N− (preferably of phosphorus with an implantation dose of from 5E12 to 5E13 atoms/cm$^2$) of portions of the regions of source 7 and drain 8 with the formation of respective regions 16, 17 aligned with floating gate 10, and the formation of upper oxide spacers 12, 13 at the sides of the floating gate. A similar implantation of type N− is simultaneously executed in the area of transistor 32 for the creation of corresponding source and drain regions 37 and 38 and similar spacers 39 and 40 are created at the sides of the gate of transistor 32.

There is thus obtained the EPROM cell 31 shown in FIGS. 1-3, and simultaneously the circuit transistor 32 shown in a FIG. 2.

In a manner well-known in the prior art, both cell 31 and transistor 32 are then completed with N+ implantations self-aligned with spacers 12, 13 and 39, 40 in regions 16, 17 and 37, 38, respectively.

We claim:

1. A process for obtaining an N-channel single polysilicon level EPROM cell, characterized in that it comprises:
    simultaneous N+ type implantation of semiconductor substrate areas of type P for the formation of a control gate and of highly doped regions of source and drain for the formation of a channel region;
    the growth of an oxide on the highly doped areas;
    the deposition and definition of a polysilicon layer, one region of which constitutes a floating gate above the control gate and the channel region, the polysilicon layer being partially superimposed above portions of the regions of highly doped regions of the source and drain;
    the N-type implantation of portions of the regions of source and drain located at the sides of the floating gate; and
    the formation of oxide spacers partially superimposed over the portions of regions of source and drain at the sides of the floating gate.

2. The process according to claim 1, further including the step of;
    implanting a P type dopant into the channel region prior to implanting the N+ type dopant for the source and drain regions into the substrate.

3. A process by which a single layer polysilicon EPROM memory cell is obtained comprising:
    implanting a relatively heavy dose of N type dopant simultaneously into regions of a semiconductor substrate that form a control gate region and source and drain regions of a transistor, the source and drain regions of the transistor defining a channel region of the transistor, the transistor being associated with the control gate, all of the implanted regions in the substrate being part of the memory cell;
    forming an oxide layer on top of the regions into which the heavy dose of N type dopant was implanted;
    depositing and defining a polysilicon layer that overlays the oxide layer and is positioned above the control gate region in the substrate;
    a portion of the polysilicon layer being a floating gate of the EPROM cell above the control gate and a portion of which is above the channel region of the transistor associated with the control gate and a portion of which is above the heavily doped regions of the source and drain.

4. The process according to claim 3, further including;
    implanting a P type dopant into the channel region prior to the implanting of a heavy dose of N type dopant that forms the source and drain regions of the transistor.

5. The process according to claim 3 wherein the forming of an oxide layer is performed by growing an oxide layer, the oxide layer being the gate oxide of the transistor.

6. The process according to claim 5 wherein the oxide layer is grown thicker over the control gate region than over the channel region, providing a final oxide thickness that is greater over the control gate region than over the channel region.

7. The process according to claim 3 wherein the heavy dose is an arsenic implant in the range of 1E14 to 1E15 atoms/cm$^2$.

8. The method according to claim 3, further including:
    implanting a relatively light dose of N type dopant into the same regions of the substrate that have previously been implanted with a heavy dose of N type impurities and that are also adjacent the region in the substrate that is overlaid by the polysilicon layer that forms the gate of the transistor.

9. The process according to claim 8 wherein the light dose is a phosphorous implant in the range of 5E12 to 5E13 atoms/cm$^2$.

10. The process according to claim 8, further including:
    forming oxide spacers adjacent the polysilicon layer and above the heavily doped source and drain regions in the substrate.

11. The process according to claim 8 wherein the lightly doped regions extend in the substrate away from the channel region, from a position adjacent that which is overlaid by the polysilicon layer to a position that is beyond the extension of the heavily doped regions.

12. The method according to claim 3, further including:
    forming an active area in a region of the substrate that is remote from the EPROM memory cell, the active area being defined by a field oxide layer on at least two sides of the active area;
    forming an oxide layer over a portion of the active region simultaneously with forming the oxide layer over the regions of the heavily doped N type dopant that forms the control gate and portions of the source and drain regions of the EPROM memory cell;
    forming a polysilicon gate by depositing and defining a polysilicon layer over the oxide layer of the active area; and
    implanting source and drain regions into the substrate adjacent that portion of the active area which is overlaid by the polysilicon layer to form a transistor that is in the active area, the active are being remote from the EPROM memory cell in the same substrate as the EPROM memory cell, the transistor being formed simultaneously with the steps which are used to form the EPROM memory cell.

13. The method according to claim 12, further including:

masking the region on the substrate that forms the active area of the second transistor when the implant of the heavy dose of N type materials performed into the region that forms the control gate for the EPROM memory cell to prevent this heavy dose of N type material from entering the active area of the second transistor.

14. A method for providing a plurality of active areas in the substrate of a semiconductor material, each active area being defined by at least two field oxide layers on either side of each active area, the method comprising;

implanting a threshold voltage implant into a first active area while simultaneously masking a second active area to not receive the threshold implant;

creating a first heavily doped region by implanting a relatively heavy dose of N type dopant into the substrate of the second active area, the second active area being one of the active areas which did not receive the threshold implant while simultaneously selectively masking a portion of the first active area that did receive the threshold implant and simultaneously creating a second heavily doped region by implanting the heavy dose into the unmasked portions of the first active area, the heavy dose into the unmasked portions of the first active area serving to form the source and drain regions of a transistor within the first active area and a channel region being formed in the substrate between the heavily doped regions, the channel region having received the threshold implant;

growing a thin oxide layer simultaneously over the first active area and the second active area;

depositing a layer of polysilicon that overlays the thin oxide grown over the first and second active areas;

etching the polysilicon layer to define a single polysilicon structure that extends over a portion of the second active area and the unmasked portions of the first active area that have been heavily doped with the N type dosage, and extends over a portion of the first active area that has received the threshold implant, the polysilicon layer forming a floating gate of an EPROM memory cell and the heavily doped region of the substrate in the second active area forming the control gate of the EPROM memory cell.

15. The method according to claim 14, further including:

forming oxide spacers along the sidewalls of the polysilicon layer.

16. The method according to claim 14, further including:

implanting a relatively light dose of N type dopant into the regions of the source and drain regions of the first active area after the polysilicon layer has been overlaid thereon, the relatively light dose of implant being adjacent and below the polysilicon layer, the relatively light dose of implant extending in the substrate from a region which is in close proximity with the channel region to respective regions that are spaced away from the channel region.

17. The method according to claim 14 wherein the heavy dose is an implant of N type material in the range of 1E14 to 1E15 atoms/cm$^2$.

* * * * *